United States Patent [19]

Babbitt et al.

[11] Patent Number: 5,075,630
[45] Date of Patent: Dec. 24, 1991

[54] VARIABLE INVERTED MICROSTRIP COAX TEST FIXTURE

[75] Inventors: Richard W. Babbitt, Fair Haven; Thomas E. Koscica, Clark; Adam Rachlin, Eatontown, all of N.J.

[73] Assignee: The United States of America as represented by the Secretary of the Army, Washington, D.C.

[21] Appl. No.: 617,127

[22] Filed: Nov. 19, 1990

[51] Int. Cl.$^5$ .................. H01P 3/08; G01R 27/04
[52] U.S. Cl. .................. 324/629; 333/246; 324/158 F
[58] Field of Search .......... 324/629, 639, 158 F; 333/246, 247

[56] References Cited

U.S. PATENT DOCUMENTS

| | | | |
|---|---|---|---|
| 4,480,240 | 10/1984 | Gould | 333/246 |
| 4,707,656 | 11/1987 | Marzan | 324/158 F |
| 5,017,865 | 5/1991 | Oldfield | 324/158 F |

FOREIGN PATENT DOCUMENTS

| | | | |
|---|---|---|---|
| 1-478156 | 5/1989 | Japan | 324/629 |
| 138882 | 5/1990 | Japan | 324/629 |

Primary Examiner—Kenneth A. Wieder
Assistant Examiner—Maura K. Regan
Attorney, Agent, or Firm—Michael Zelenka; William H. Anderson

[57] ABSTRACT

A test fixture for inverted microcircuits having spaced shelf assemblies with parallel shelves for respectively supporting a substrate for a microcircuit and a substrate for a ground plane in such a manner that the distance between them can be varied while test signals are coupled to the microcircuit via a coaxial cable coupled to a fitting on one shelf assembly and signals are coupled from the microcircuit via a coaxial cable coupled to a fitting on the other shelf assembly to test apparatus for determining the performance of the circuit.

12 Claims, 2 Drawing Sheets

VARIABLE INVERTED MICROSTRIP COAX TEST FIXTURE

GOVERNMENT INTEREST

The invention described herein may be manufactured, used, and licensed by or for the Government for governmental purposes without the payment to us of any royalty thereon.

FIELD OF INVENTION

This invention relates to a fixture for testing inverted microstrip circuits.

BACKGROUND OF THE INVENTION

Microwave circuits are generally comprised of a substrate of dielectric material having a conduction layer extending over all of one side that serves as a ground plane and circuit devices and interconnections therefor on the other. With superconducting circuits operating at millimeter wave lengths, the high dielectric constant of the substrate leads to small circuits having high current densities so that device coupling and high losses may result. In such circumstances it has been found advantageous to mount the circuit on one side of a dielectric substrate and to form the ground plane on one surface of another substrate that is mounted in spaced parallel relation to the first in such manner that the circuit and ground plane face each other. Thus, air which has the lowest possible dielectric constant and lowest loss tangent lies between the ground plane and the circuit so as to increase circuit size and decrease losses. This is called an inverted microstrip structure.

One of the problems encountered with inverted microstrip circuits is the fact that circuits may respectively require different separations between them and their ground planes for optimum performance; this is done to change the characteristic impedance of the medium through which the wave travels. It would therefore be highly advantageous to know the optimum separation before the circuit assembly is finally designed. At the present time, no known means is available for determining the optimum separation in advance.

SUMMARY OF THE INVENTION

In accordance with this invention, a test fixture for an inverted microstrip circuit is provided in which the distance between it and a ground plane is varied while the performance of the circuit is monitored, thereby making it possible to find the distance at which optimum operation occurs. The circuit designer can then use the distance in the final product.

Although such a test fixture may have different forms, a simple effective structure is comprised of a first support means on which a substrate having a microstrip circuit may be mounted, means for respectively coupling a coaxial cable to input and output terminals of a microstrip circuit mounted on said first support means, and second support means for supporting a ground plane at different distances from a microstrip circuit mounted on said first support means.

One embodiment of the invention is comprised of a bracket having a base, a top, a wall joining the top and base, two shelf assemblies positioned between the base and top of the bracket with their shelves perpendicular to the wall, and therefore parallel, and fittings to which coaxial cables can be attached on their remote sides. Each shelf assembly is comprised of end members between which the shelves extend. The shelves project beyond the end members so that substrates of a circuit and a ground plane may be easily placed on them. The shelves in which the substrate of a circuit are to be placed are split into two sections so as to form a gap between them through which central conductors of coaxial cables may be made to respectively pass so as to make electrical contacts with points on a circuit resting on the split shelves. In order to accommodate substrates for the circuits and ground planes having different dimensions, means are provided whereby the distance between the shelving assemblies can be adjusted, e.g. a slot in the top of the bracket through which screws can be passed that respectively engage the shelf assemblies. The shelf assemblies can be moved toward or away from each other by loosening the screws. Once in place, the shelf assemblies are held in the new position by tightening the screws.

In one specie of the invention, the second support means for supporting a ground plane at different distances from a microstrip circuit mounted on the first support means is comprised of a plurality of shelves in each shelf assembly in addition to the split shelves for supporting the substrate of a microstrip circuit. The substrate for the microcircuit is placed on the split shelves, and the substrate of the ground plane is sequentially placed on the other shelves until optimum circuit performance is obtained. In a second specie, the second support means is comprised of a shelf in each shelf assembly that is moveable with respect to the split shelves. The substrate for the microcircuit is placed on the split shelves, the substrate for the ground plane is placed on the moveable shelves, and the latter shelves are moved until optimum circuit performance is obtained.

BRIEF DESCRIPTION OF THE DRAWINGS

Various embodiments of the invention are described in detail below with reference to the accompanying drawings, in which like items are indicated by the same reference designation, wherein.

DETAILED DESCRIPTION OF THE INVENTION

Figure 1:
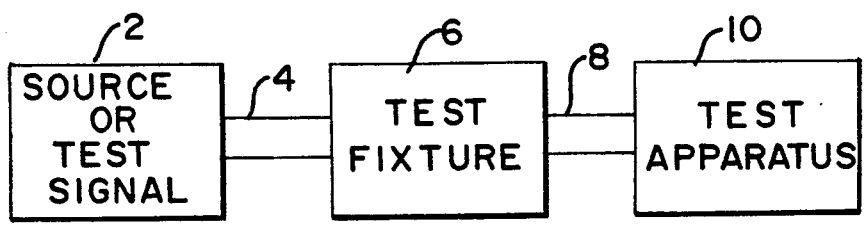
FIG. 1 is a diagram showing the position of a test fixture of this invention with respect to a source of test signals and apparatus for testing the performance of the circuit.

As shown in FIG. 1, a source 2 of test signals for a microstrip circuit is coupled via a coaxial cable 4 to one side of a test fixture 6 constructed in accordance with this invention, and a coaxial cable 8 couples the other side of the test fixture 6 to test apparatus 10 for evaluating circuit performance.

In the projection view of FIG. 1, a test fixture of this invention is shown as being constructed of a bracket 12 having a base 14, a top 16 and a back 18. A first shelf assembly 19 is comprised of a tier of shelves 20, 22, 24, 26 and 26' supported between end members 28 and 30 that extend between the base 14 and the top 16 of the bracket 12. A second shelf assembly 31 is comprised of another tier of shelves 32, 24, 26, 38, and 38' that are respectively parallel to and spaced from the shelves 20, 22, 24, 26 and 26' and are supported between end members 40 and 42 that extend between the base 14 and the top 16. The shelves of both shelf assemblies are perpendicular to the wall 18. Shelves 26, 26' are horizontally spaced from each other so as to form a gap 27 between them, and shelves 38, 38' are horizontally spaced from each other so as to form a gap 29 between them. A top member 44, only a portion of which is visible, extends between the tops of the end members 28 and 30 to complete the shelf assembly 19, and a top member 46, only a portion of which is visible, extends between the tops of the end members 40 and 42 to complete the shelf assembly 31. The end members 28, 30, 40 and 42, merely rest on the base 14 so that they can be moved about on it. A screw 48 extends through a slot 50 in the top 16 of the bracket 12 and is threaded into the top member 44 so as to hold the shelf assembly 19 in position. In a similar manner, a screw 52 extends through the slot 50 and into the top member 46 so as to hold the shelf assembly 31 in position. The slot 50 is parallel to the wall 18 and therefore horizontally perpendicular to the shelves so that the horizontal distances between the shelf assemblies 19 and 31 can be easily adjusted as required to accommodate substrates of different widths. If desired, one shelf assembly could be in a fixed position and the slot 50 and the screw for the other shelf assembly could be used to adjust its position. Other means could be provided for adjusting the distance between the shelf assemblies 19 and 31.

It is to be noted that the shelves 20-26, 26' and 32-38, 38' extend inwardly from the support members 28, 30 and 40, 42 respectively so that a substrate having a microcircuit thereon can easily be placed on the shelves 26, 26', 38, 38', and a substrate having a ground plane on one side thereof can easily be rested on any of the opposed pairs of shelves 20, 32; 22, 34; and 24, 36.

A coaxial cable fitting 54 is attached to the outer sides of one or more shelves in the shelf assembly 19 in such manner that the outer conductor of a coaxial cable mounted thereon will be in electrical contact with at least one shelf. Grounding of the outer conductor is easily provided by making at least one shelf to which the fitting is connected, at least one of the end members 28, 30 and at least the top 16 of the U bracket out of metal and connecting any of these parts to ground. As a practical matter, it would be easier to make the entire test fixture out of metal. A coaxial cable fitting 56 is attached to the outer side of the shelf assembly 31 in a similar manner.

The coaxial cable fittings 54 and 56 are positioned such that the central conductors of coaxial cables attached thereto may respectively made to extend through the gaps 27 and 29 so that they would appear as indicated at 54' and 56' and make electrical contacts at respective points on a microcircuit on the side of a substrate placed on the corresponding sets of shelves 26, 26' and 38, 38'. Test signals from the source 2 may be coupled via a coaxial cable attached to the fitting 54, and signals from the microcircuit may be coupled to test apparatus 10 via a coaxial cable coupled to the fitting 56.

Figure 3:
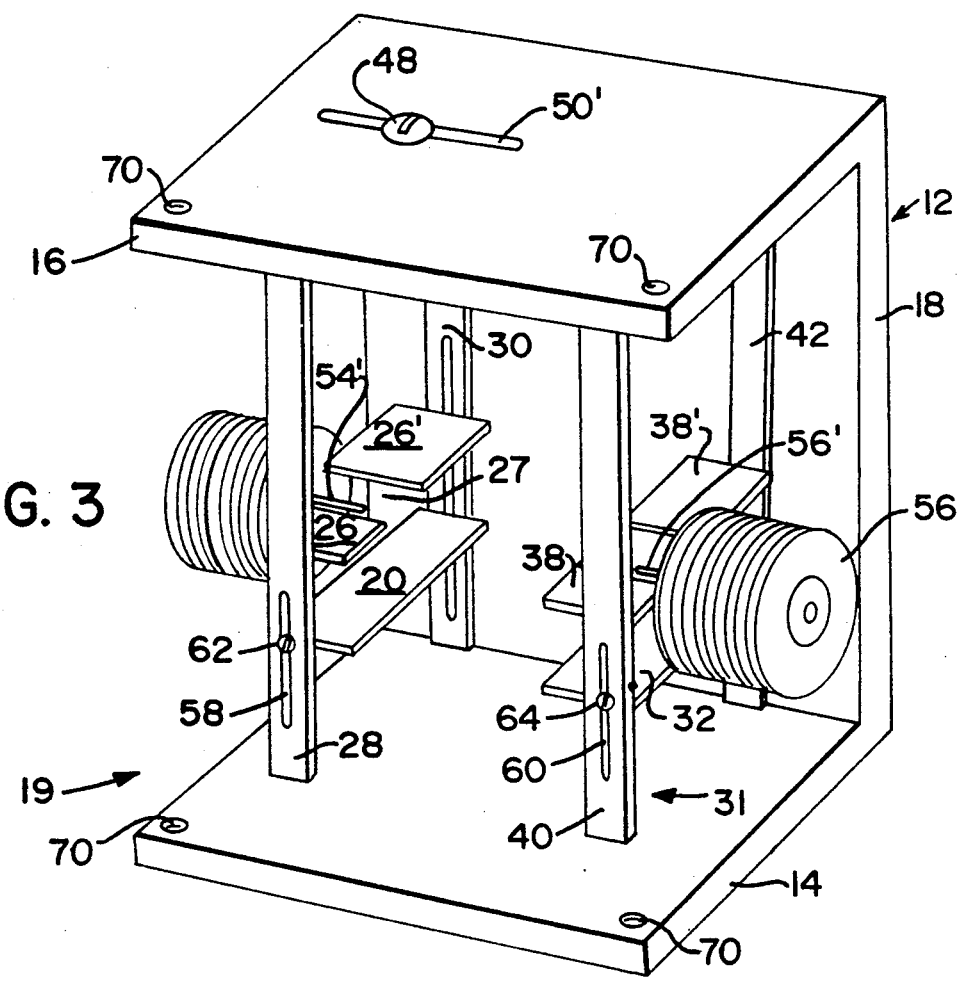
FIG. 3 is a projection view of a test fixture of this invention having only two pairs of shelves one of which can be moved toward or away from the other pair.

In the specie of FIG. 3, the shelves 22, 24 of the shelf assembly 19 and the shelves 34,36 of the shelf assembly 31 are omitted, and means are provided for vertically positioning the set of corresponding shelves 20 and 32 with respect to the corresponding set of shelves 26, 26' and 38, 38'. In this embodiment, the means is comprised of vertical slots 58 and 60, respectively, extending through the end members 28 and 40 and screws 62 and 64 that respectively extend through the slots 58 and 60 so as to engage threaded apertures (not shown) at the ends of the shelves 20 and 32. The shelves 20 and 32 may be moved toward and away from the shelves 26, 26', 38, 38' by loosening the screws 62 and 64 and held in position by tightening them. In this specie of the invention, the shelf assembly 31 is permanently mounted to the bracket 12, and a slot 50' is provided in the top 16 that is shorter than the slot 50 of FIG. 1 so that the screw 52 is not used. Only the shelf assembly 19 is moveable.

Alternatively, the shelf assemblies 19 and 31 could be comprised of solid metal plates extending between the bottom 14 and the top 16 of the bracket 12, respectively, and having tiers of shelves extending from one side thereof.

Figure 2:
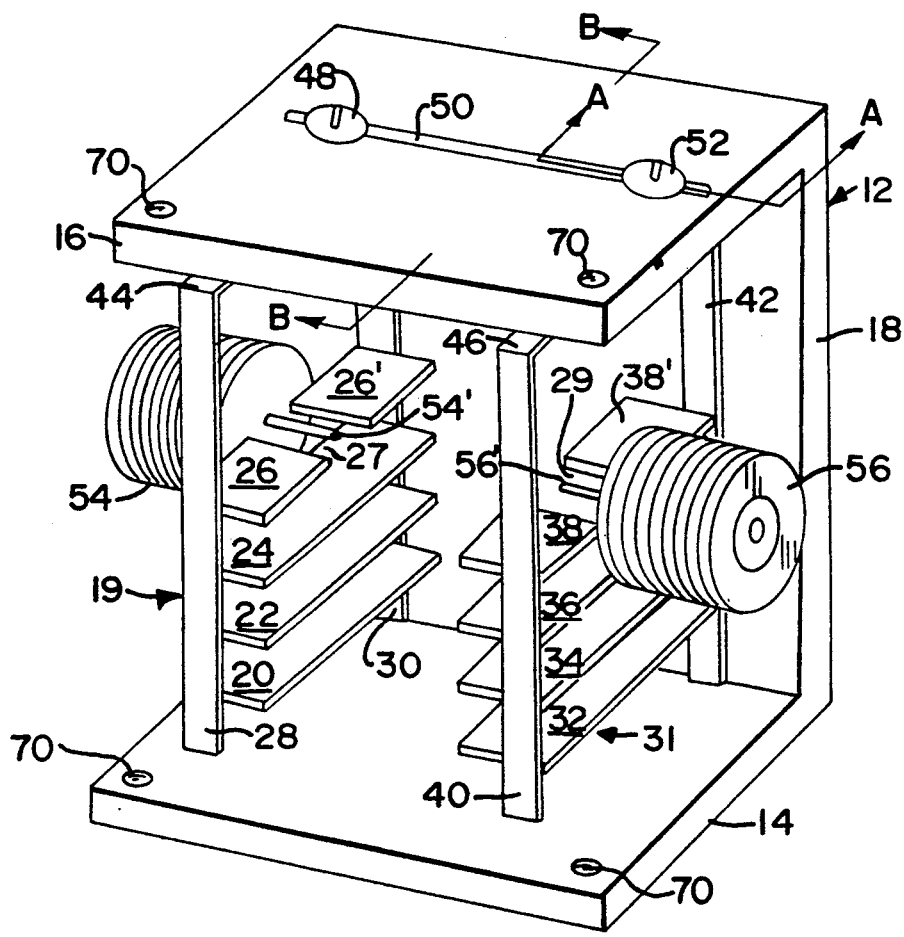
FIG. 2 is a projection view of a test fixture constructed in accordance with this invention having more than two pairs of shelves.
Figure 2A:
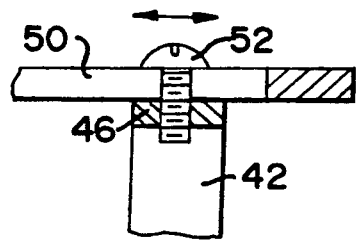
FIG. 2A is a section AA of FIG. 2 showing the detail of a screw assembly used in adjusting the distance between shelf assemblies.
Figure 4:
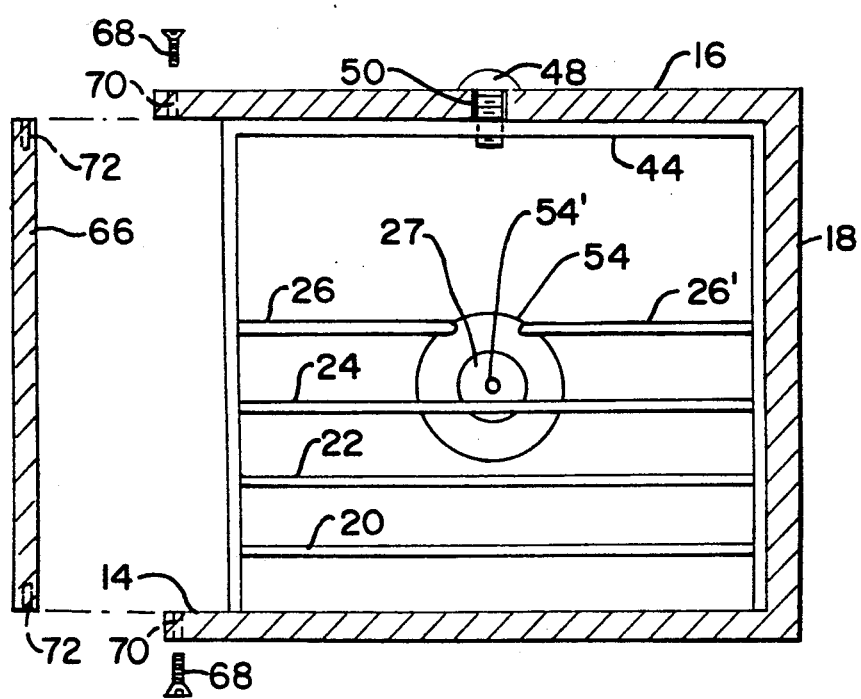
FIG. 4 is a section BB of FIG. 1.

FIG. 4 is a section BB of FIG. 2 showing the break 27 between the shelves 26 and 26' through which a central conductor 54' of a coaxial cable coupled to the fitting 54 would extend. The fitting 54 can be spot welded to the shelves 26, 26' and 24. In the specie of FIG. 3, the fitting 54 would only be spot welded to the shelves 26 and 26'. If the fitting 54 is only welded to the shelves 26 and 26', greater stability can be attained by forming flanges (not shown) on their outer edges and welding the fitting 54 to the flange. Although not shown in the other figures of the drawings, a second side wall 66 is shown in FIG. 4 as being connected to the top wall 16 and the bottom wall 14 by screws 68 extending through holes 70 in the top wall 16 and the bottom wall 14 and into threaded aperture 72 in the side wall 66. A section taken in the opposite horizontal direction from BB would be similar.

What is claimed is:

1. A test fixture for inverted microwave circuits comprising:
    a bracket having a base, a top and a wall joining said base and said top;
    a first shelf assembly mounted between said base and said top having a first tier of shelves and a first split shelf having two parts separated by a first gap;
    a second shelf assembly mounted directly opposite said first shelf assembly and mounted between said base and said top, said second shelf assembly having a second tier of shelves that are respectively parallel to and in the same plane as said first tier of shelves and a second split shelf that is parallel to and in the same plane as said first split shelf of said first tier, said second split shelf having two parts separated by a second gap;
    a first fitting for a coaxial cable attached to the side of at least one shelf of said first tier that is remote from said second tier of shelves in such a manner that an extension of a central conductor of a coaxial cable mounted thereon would extend parallel to said shelves; and
    a second fitting for a coaxial cable attached to the side of at least one shelf of said second tier that is remote from said first tier of shelves in such manner that an extension of a central conductor of a coaxial cable mounted thereon would extend parallel to said shelves.

2. A test fixture as set forth in claim 1 further comprising:
means for adjusting the distances between said tiers of shelves.

3. A test fixture as set forth in claim 2 wherein said means for adjusting the distances between said tiers of shelves is comprised of:
means defining a slot in the top of said bracket;
means defining a threaded hole in at least one of said first and second shelf assemblies; and
a screw extending through said slot and threadedly engaging the threads in said hole.

4. A test fixture as set forth in claim 1 further comprising:
means for adjusting the distances between corresponding shelves of said first and second tiers of shelves from the shelves in said tier defining said first and second gaps.

5. A test fixture as set forth in claim 4 wherein said means for adjusting distances between shelves is comprised of:
end members respectively supporting said first and second tiers of shelves;
means defining slots in each of said end members,
means defining threaded hole at the ends of corresponding shelves; and
screws respectively extending through said slots and engaging the threads in said holes.

6. A test fixture as set forth in claim 1 wherein:
said first and second tiers of shelves are respectively supported by end members; and
said shelves of said tiers protrude from their respective end members toward each other; whereby substrates may be passed between the end members of each tier and rested on corresponding shelves thereof.

7. A test fixture for inverted microstrip circuits comprising:
a bracket having a base, top and a wall joining said top and base;
first and second shelf assemblies mounted between said base and said top, each of said assemblies having at least two shelves;
a first coaxial cable fitting mounted in the side of said first shelf assembly that is remote from said second shelf assembly; and
a second coaxial fitting mounted on the side of said second shelf assembly that is remote from said first shelf assembly.

8. A test fixture as set forth in claim 7 further comprising:
means defining a slot in the top of said bracket, said slot being parallel to the wall; and
at least one screw extending through said slot and engaging one of said shelf assemblies, whereby said assemblies may be positioned at different distances from each other.

9. A test fixture as set forth in claim 7 wherein:
each of said shelf assemblies has more than two shelves.

10. A test fixture as set forth in claim 7 further comprising:
means for adjusting the distance between one set of corresponding shelves of said shelf assemblies and another set of corresponding shelves of said shelf assemblies.

11. A test fixture as set forth in claim 8 wherein:
each of said shelf assemblies has more than two shelves.

12. A test fixture as set forth in claim 8 further comprising:
means for adjusting the distance between one set of corresponding shelves of said shelf assemblies and another set of corresponding shelves of said shelf assemblies.

* * * * *